United States Patent
Draper

(10) Patent No.: US 7,412,624 B1
(45) Date of Patent: Aug. 12, 2008

(54) METHODS AND APPARATUS FOR DEBUGGING A SYSTEM WITH A HUNG DATA BUS

(75) Inventor: Andrew Draper, Chesham (GB)

(73) Assignee: Altera Corporation, San Jose, CA (US)

( * ) Notice: Subject to any disclaimer, the term of this patent is extended or adjusted under 35 U.S.C. 154(b) by 491 days.

(21) Appl. No.: 10/940,936

(22) Filed: Sep. 14, 2004

(51) Int. Cl.
*G06F 11/00* (2006.01)

(52) U.S. Cl. ......................................... 714/34

(58) Field of Classification Search ............ 714/32, 714/34, 37, 42, 50
See application file for complete search history.

(56) References Cited

U.S. PATENT DOCUMENTS

| | | | | |
|---|---|---|---|---|
| 5,467,354 A | * | 11/1995 | Yamauchi | 714/729 |
| 6,530,047 B1 | * | 3/2003 | Edwards et al. | 714/724 |
| 6,539,497 B2 | * | 3/2003 | Swoboda et al. | 714/30 |
| 6,715,105 B1 | * | 3/2004 | Rearick | 714/30 |
| 6,988,232 B2 | * | 1/2006 | Ricchetti et al. | 714/736 |
| 7,069,485 B2 | * | 6/2006 | Whetsel et al. | 714/726 |
| 2003/0159096 A1 | * | 8/2003 | Balzer | 714/726 |
| 2003/0163773 A1 | * | 8/2003 | O'Brien et al. | 714/726 |

* cited by examiner

*Primary Examiner*—Nadeem Iqbal
(74) *Attorney, Agent, or Firm*—Ropes & Gray LLP; Robert Jackson; Chia-Hao La

(57) ABSTRACT

Methods and apparatus are provided to facilitate debugging of a system with a hung data bus. A register scan chain is used to read data from logic blocks of the hung system. The scan chain is also used to write data into the logic blocks, possibly resetting a subset of those blocks or otherwise causing them to exit the hung state. The resetting may terminate the hung instruction in a manner that allows subsequent instructions to be executed, including entry into debug mode.

28 Claims, 3 Drawing Sheets

METHODS AND APPARATUS FOR DEBUGGING A SYSTEM WITH A HUNG DATA BUS

BACKGROUND OF THE INVENTION

Hardware system development often involves debugging complex designs. As such, various circuits and protocols have been created to make the debugging process more efficient. For example, the Joint Test Action Group ("JTAG") standard was developed specifically for this purpose. The standard comprises a JTAG cable connecting a user's host computer to an integrated circuit. The cable includes circuitry to facilitate a variety of debugging operations, such as the ones described below.

The operations typically used when debugging a processor over JTAG include entry into debug mode, reading and writing of memory elements on the integrated circuit, and exit from debug mode. These functions permit users to diagnose a system by observing and changing the state of that system after it encounters a problem. The debug instructions are carried out on the same instruction pipeline that is used during normal operation.

A problem can arise when the target chip includes a processor whose data bus has hung. For instance, the processor may initiate a read instruction that fails to complete, thereby suspending operation on the data bus indefinitely. The instruction pipeline is unable to finish the read instruction, and thus cannot perform debugging instructions (e.g., entry into debug mode). Under these circumstances, the only option is to reset the processor, which results in loss of information about the system's state at the time of the hang.

In view of the foregoing, it would be desirable to develop circuitry and methods to force the processor out of a hung state, thereby permitting entry into debug mode. Furthermore, it would be desirable to perform this task in a manner that preserves as much system state as possible, for future reading and manipulation during debug mode.

SUMMARY OF THE INVENTION

In accordance with this invention, circuitry and methods are provided to read data from different portions of an integrated circuit and to reset selected portions in order to release the data bus from a hung state. An exemplary embodiment of the invention comprises a scan chain, which is added to the existing JTAG circuitry. Each of the scan chain registers is connected to a specific logic block on the integrated circuit.

In a preferred embodiment, the scan chain operates as follows. First, all registers in the chain read data from their corresponding logic blocks. Next, the contents of the scan chain are shifted out over a certain number of clock cycles, simultaneously shifting in new values to the registers. Finally, the new values are written to the system logic blocks, possibly resetting certain parts of the system and releasing the bus from a hung state.

The invention therefore advantageously allows users to examine the state of a system during a data bus hang, modify portions of the system logic to release the system from the hang, and subsequently enter debug mode. The invention comprises, at minimum, at least one shift register connected to at least one portion of the system to be tested, and is therefore easy to incorporate into existing systems.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
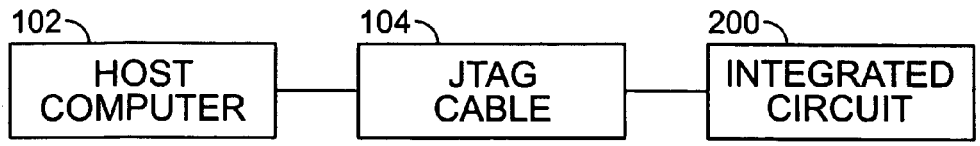
FIG. 1 is a block diagram of an illustrative system for debugging an integrated circuit.

FIG. 1 shows an illustrative debugging system. Host computer 102 can be any device that accepts user input directly, such as a personal computer system. It is connected to a JTAG cable 104, which includes circuitry for facilitating various JTAG operations. Integrated circuit ("IC") 200 is the chip to be debugged. IC 200 may be an application-specific integrated circuit ("ASIC"), a programmable logic device ("PLD"), or a hybrid of the two. Although the present invention is described in the context of JTAG debugging, it should be recognized that the invention is applicable to other contexts as well. In fact, it can be applied to any hung circuit whose state can be examined and modified with the use of registers.

Figure 2:
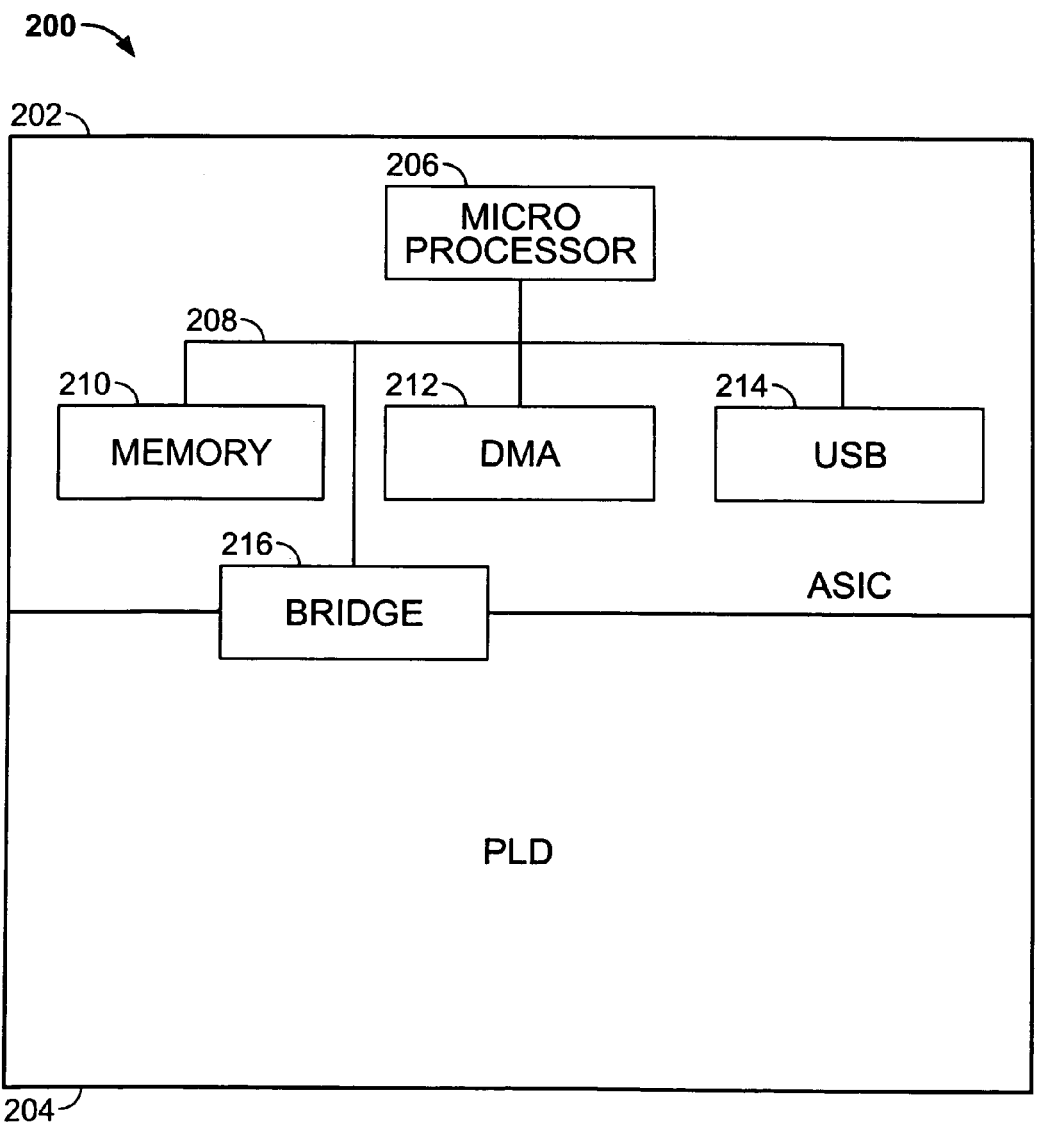
FIG. 2 is a block diagram of an illustrative embodiment of the integrated circuit of FIG. 1.

FIG. 2 shows an illustrative embodiment of IC 200. It comprises an ASIC portion 202 and a PLD portion 204. The circuitry of ASIC portion 202 is set at the time of manufacture, while PLD portion 204 is reconfigurable by the user. At least some of the logic in ASIC portion 202 is controlled by microprocessor 206, which is connected to a bus 208. The bus permits communication with various circuit blocks, such as memory circuitry 210, Direct Memory Access ("DMA") circuitry 212, Universal Serial Bus ("USB") circuitry 214, and bridge circuitry 216. Bridge circuitry 216 facilitates communication between the two portions of IC 200. For instance, if ASIC portion 202 and PLD portion 204 use different clock frequencies, bridge circuitry 216 would provide buffering to allow data to be transferred between the two domains.

Figure 3:
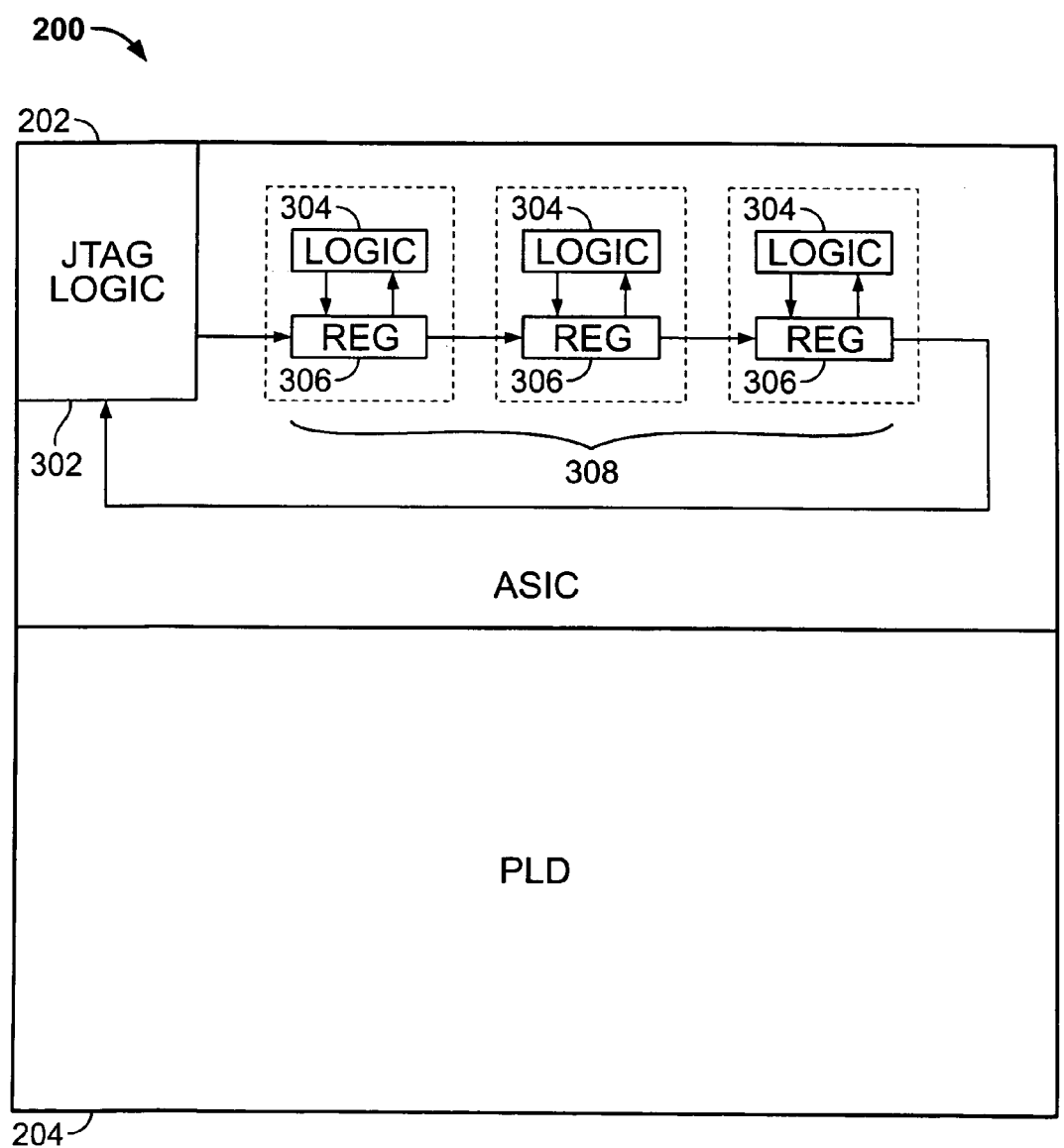
FIG. 3 is a block diagram of an illustrative embodiment of the integrated circuit of FIG. 1 according to the invention.

FIG. 3 shows the same IC 200 incorporating a JTAG scan chain in accordance with the invention. JTAG logic block 302 allows IC 200 to communicate with JTAG cable 104 shown in FIG. 1. It receives commands and data which are at least partially provided by the user. Logic blocks 304 comprise blocks of circuitry implemented on ASIC portion 202 of IC 200. For instance, the three logic blocks 304 shown in FIG. 3 might correspond to microprocessor 206, memory circuitry 210, and bridge circuitry 216. Alternatively, multiple logic blocks may belong to a single module, such as DMA circuitry 212.

Each logic block 304 is connected to corresponding shift register circuitry 306. Shift register circuitry 306 may contain a single register or several registers connected in a chain. Shift register circuitries 306 connect to each other to form scan chain 308. The first register in the chain accepts input from JTAG logic 302, and the last register outputs data to JTAG logic 302. Each register 306 in scan chain 308 can perform at least three functions. First, it can read data from its corresponding logic block 304. Second, it can shift its contents to the next register in the chain. While it shifts data out to the next register, it can simultaneously shift data in from the previous register. Third, it can write data to its corresponding logic block. Although three logic blocks 304 are shown in FIG. 3, IC 200 may include many more logic blocks, each with its own corresponding shift register circuitry 306.

The data read from logic blocks 304 to scan chain 306 comprise data values or status signals. For example, the data may contain a memory address, data read from memory, or status bits indicating whether a first-in-first-out ("FIFO") queue is full. On the other hand, the data written from scan chain 308 to logic blocks 304 comprise control bits that can trigger certain actions in logic blocks 304. In a preferred embodiment of the invention, a data value of 0 transferred to a logic block may have no effect on the block, but a data value of 1 will reset the block in question.

Now, suppose microprocessor 206 is communicating with a peripheral, such as one of those shown in FIG. 2. For purposes of illustration, suppose microprocessor 206 is communicating with circuitry in PLD portion 204, via bus 208 and bridge circuitry 216. Also suppose that microprocessor 206 issues a read request to the circuitry in PLD portion 204, but that circuitry cannot fulfill the request. The circuitry in PLD portion 204 will hang, which will in turn hang bridge circuitry 216 and part of bus 208. As a result, microprocessor 206 will become stuck in a potentially infinite wait, and cannot process further instructions. Because its instruction pipeline is tied up, the user is unable to execute an instruction to enter JTAG debug mode. Without the present invention, the only possible response would be to reset the entire system. The system state at the time of the failed request would be lost, making the cause of the hang difficult to determine.

Figure 4:
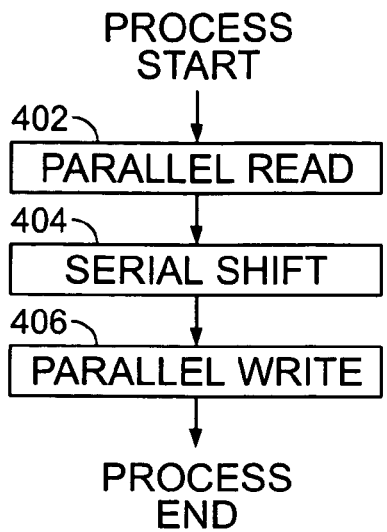
FIG. 4 is a flow diagram of an illustrative method according to the invention.

The invention advantageously provides an alternative course of action, which is typically taken only if normal requests to enter debug mode have not succeeded. This course of action is illustrated in FIG. 4. At step 402, data is read from logic blocks 304 into scan chain 308. In the example described above, this data might comprise the address of the read request, which could be valuable for later debugging and analysis. Next, in step 404, the captured data is shifted through scan chain 308 into JTAG logic 302 over a plurality of clock cycles. While the contents of scan chain 308 are being shifted out, control data is simultaneously shifted in. Once the contents of the entire chain have been shifted, the new data contained in scan chain 308 is written to data blocks 304 in step 406. The new data may contain a value of 1 at selected logic blocks, which will serve to reset those blocks. In the example described above, the interface between bridge circuitry 216 and the circuitry in PLD portion 204 may be reset.

Although resetting this interface may result in an error signal being transmitted to microprocessor 206 and the disabling of bridge 216, most of IC 200 will still be functional. In particular, microprocessor 206 will finish the read instruction in an error state, and be able to accept further instructions in the instruction pipeline. This allows the user to enter JTAG debug mode, and control the operation of IC 200 as desired. Therefore, although the originally requested data is never received, the instruction is still able to terminate in a graceful manner.

It should be noted that the embodiments shown in FIGS. 1 to 4 are merely illustrative. Other variations could be used. For instance, the invention applies not only to entry into JTAG debug mode, but to any situation where a system can be forced out of a hung state using a plurality of control signals. In addition, FIG. 3 shows all the logic blocks 304 and register circuitries 306 residing in ASIC portion 202 of IC 200. This need not be the case. In fact, the example described above involves a bridge communicating with both ASIC portion 202 and PLD portion 204. The invention can also be applied to logic blocks residing entirely in PLD portion 204. Finally, when writing data from scan chain 308 to logic blocks 304, it is not necessary to use logic 0 to represent a default action and logic 1 to perform reset operations. The reverse convention could be used, or the convention could depend on each particular logic block, or on the current mode of operation of IC 200.

Figure 5:
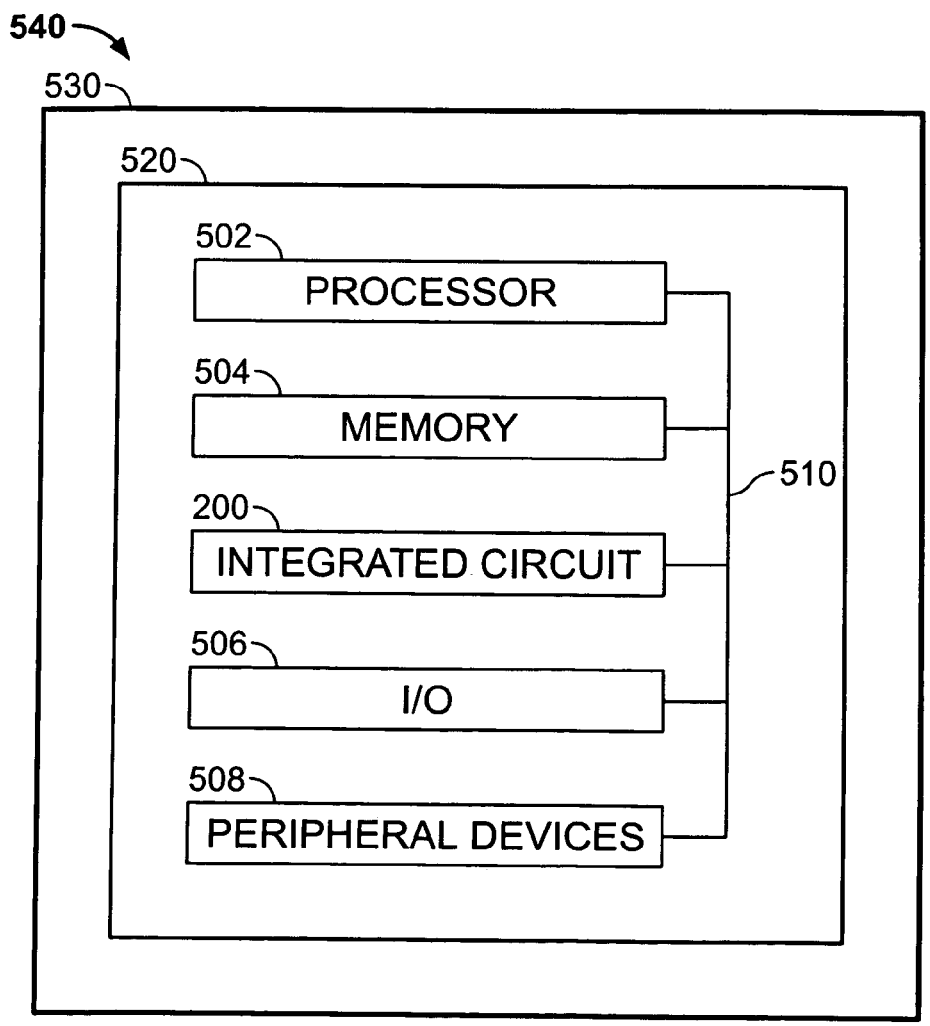
FIG. 5 is a block diagram of an illustrative data processing system incorporating the invention.

FIG. 5 illustrates an IC 200 of this invention in a data processing system 540. Data processing system 540 may include one or more of the following components: processor 502; memory 504; I/O circuitry 506; and peripheral devices 508. These components are coupled together by a system bus 510 and are populated on a circuit board 520 which is contained in an end-user system 530.

System 540 can be used in a wide variety of applications, such as computer networking, data networking, instrumentation, video processing, digital signal processing, or any other application where the advantage of using programmable or reprogrammable logic is desirable. IC 200 can be used to perform a variety of different logic functions. For example, IC 200 can be configured as a processor or controller that works in cooperation with processor 502. IC 200 may also be used as an arbiter for arbitrating access to a shared resource in system 540. In yet another example, IC 200 can be configured as an interface between processor 502 and one of the other components in system 540.

Thus it is seen that circuits and methods are provided for reading data from a hung system, and for forcing the system out of its hung state. One skilled in the art will appreciate that the invention can be practiced by other than the described embodiments, which are presented for purposes of illustration and not of limitation, and the present invention is limited only by the claims which follow.

I claim:

1. Circuitry for forcing an integrated circuit out of a hung state, comprising:
   at least one logic block implemented on the integrated circuit; and
   at least one shift register circuit implemented on the integrated circuit, associated with the at least one logic block, wherein:
   the at least one shift register circuit can write control data to the at least one logic block; and
   each of the at least one logic block can reset itself responsive to the value of the control data.

2. The circuitry of claim 1, further wherein:
   the at least one shift register circuit can read status data from the at least one logic block.

3. The circuitry of claim 2, wherein:
   the status data comprises memory address data.

4. The circuitry of claim 2, wherein:
   the status data comprises data indicating a status of at least one first-in-first-out ("FIFO") queue.

5. The circuitry of claim 2, wherein:
   the status data comprises data indicating a status of at least one internal signal within the at least one logic block.

6. The circuitry of claim 1, wherein:
   each of the at least one logic block is configured to reset itself responsive to a value of 1 in the control data.

7. The circuitry of claim 1, wherein:
   each of the at least one block is configured to release itself from a hung state responsive to a value of 1 in the control data.

8. The circuitry of claim 1, wherein:
the at least one logic block comprises a microprocessor and bridge circuitry.

9. The circuitry of claim 8, wherein:
resetting at least part of the bridge circuitry can release the microprocessor from a hung state.

10. The circuitry of claim 9, wherein:
the hung state results from an unterminated read request issued from the microprocessor through the bridge circuitry.

11. The circuitry of claim 1, further comprising:
JTAG logic circuitry connected to the at least one shift register circuit.

12. The circuitry of claim 11, wherein:
the JTAG logic circuitry can provide the control data for the at least one shift register circuit.

13. The circuitry of claim 12, wherein:
the JTAG logic circuitry can accept the status data from the at least one shift register circuit.

14. The circuitry of claim 11, further comprising:
a JTAG cable connected to the JTAG logic circuitry; and
a host computer connected to the JTAG cable.

15. An integrated circuit, comprising the circuitry of claim 1.

16. The integrated circuit of claim 15, wherein the integrated circuit comprises:
an ASIC portion; and
a PLD portion.

17. A printed circuit board, comprising the integrated circuit of claim 15.

18. A data processing system, comprising the printed circuit board of claim 16.

19. A method of forcing an integrated circuit out of a hung state, comprising:
reading status data from at least one logic block implemented on the integrated circuit to at least one shift register implemented on the integrated circuit;
shifting the status data out of the at least one shift register;
shifting control data into the at least one shift register; and
writing the control data from the at least one shift register to the at least one logic block.

20. The method of claim 19, wherein:
the writing is capable of resetting each of the at least one logic block, responsive to the control data.

21. The method of claim 20, wherein:
resetting the at least one logic block can terminate a read instruction.

22. The method of claim 19, wherein:
the shifting the status data and the shifting the control data occur simultaneously.

23. The method of claim 19, wherein:
the status data is processed by JTAG logic circuitry; and
the control data is transferred from JTAG logic circuitry.

24. The method of claim 19, further comprising:
resetting the at least one logic block to release the integrated circuit from a hung state; and
executing an instruction to enter debug mode.

25. Circuitry for reading status data from an integrated circuit and writing control data to the integrated circuit, comprising:
means for reading the status data from at least one logic block implemented on the integrated circuit; and
means for writing the control data from at least one shift register implemented on the integrated circuit to the at least one logic block, wherein:
the reading and writing can be performed while the integrated circuit is in a hung state; and
the writing can release the integrated circuit from the hung state.

26. The circuitry of claim 25, wherein the at least one logic block comprises:
a microprocessor; and
a peripheral connected to the microprocessor.

27. The circuitry of claim 26, wherein:
the integrated circuit enters the hung state after processing a read request from the microprocessor to the peripheral.

28. The circuitry of claim 25, further comprising:
means for controlling the reading and writing using a JTAG protocol; and
means for entering a JTAG debug mode after releasing the integrated circuit from the hung state.

* * * * *